(12) United States Patent
Yamamoto

(10) Patent No.: US 7,414,713 B2
(45) Date of Patent: Aug. 19, 2008

(54) METHOD OF MEASURING FOCAL POINT, INSTRUMENT USED THEREFOR, AND METHOD OF FABRICATING SEMICONDUCTOR DEVICE

(75) Inventor: Tomohiko Yamamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 701 days.

(21) Appl. No.: 10/799,739

(22) Filed: Mar. 15, 2004

(65) Prior Publication Data

US 2005/0069791 A1   Mar. 31, 2005

(30) Foreign Application Priority Data

Sep. 29, 2003   (JP) ............... 2003-338142

(51) Int. Cl.
*H01L 21/027* (2006.01)
*G03F 7/20* (2006.01)

(52) U.S. Cl. ............... 356/123; 356/125; 356/399; 356/400; 356/401; 356/618; 430/5

(58) Field of Classification Search ......... 356/123–125, 356/399–401
See application file for complete search history.

(56) References Cited

U.S. PATENT DOCUMENTS

| | | | |
|---|---|---|---|
| 6,027,842 A * | 2/2000 | Ausschnitt et al. | 430/30 |
| 6,879,400 B2 * | 4/2005 | Ausschnitt et al. | 356/401 |
| 7,006,208 B2 * | 2/2006 | Starikov et al. | 356/123 |
| 2004/0058256 A1 * | 3/2004 | Fujisawa et al. | 430/30 |

FOREIGN PATENT DOCUMENTS

| | | | | |
|---|---|---|---|---|
| EP | 0 973 068 A2 | 1/2000 | | |
| JP | 62-160723 A * | 7/1987 | | 356/401 |
| JP | 10-154647 A | 6/1998 | | |
| JP | 11-307431 | 11/1999 | | |
| JP | 2000-223413 | 8/2000 | | |
| JP | 2002-75815 | 3/2002 | | |

OTHER PUBLICATIONS

Patent Abstracts of Japan, Publication No. 10154647, dated Jun. 9, 1968.
Patent Abstracts of Japan, Publication No. 2000133569, dated May 12, 2000.
Japanese Office Action dated Feb. 5, 2008, issued in corresponding Japanese Application No. 2003-338142.

* cited by examiner

*Primary Examiner*—L. G. Lauchman
*Assistant Examiner*—Rebecca C Slomski
(74) *Attorney, Agent, or Firm*—Westerman, Hattori, Daniels & Adrian, LLP

(57) ABSTRACT

A shape value of a pattern having a pivotal characteristic is measured (step S1), an exposure energy variation is detected from the measured value, a first data base is accessed using a result of the measurement of the shape value (Step S2), an exposure energy is calculated (Step S3), a shape value of an isolated pattern is measured (Step S4), a second data base is accessed using a result of the measurement (Step S5), and a focal variation is determined using the calculated proper exposure energy (Step S6).

23 Claims, 11 Drawing Sheets

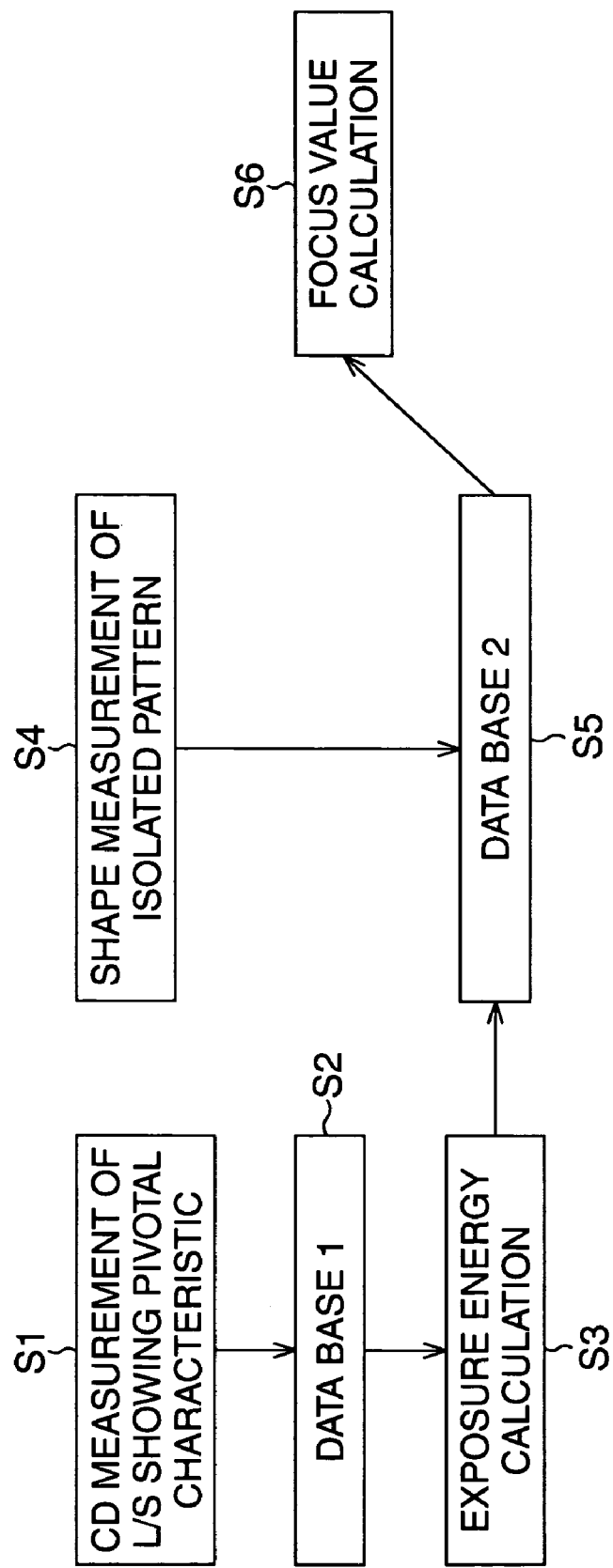

FIG. 5A

| 1:1 L/S | Dose=194J | Dose=196J | Dose=198J | Dose=200J | Dose=202J | Dose=204J | Dose=206J |
|---|---|---|---|---|---|---|---|
| CD | 126nm | 124nm | 122nm | 120nm | 118nm | 116nm | 114nm |
| Angle | 88° | 88° | 88° | 88° | 88° | 88° | 88° |

FIG. 5B

| ISOLATED LINE | Focus=−0.06 | Focus=−0.04 | Focus=−0.02 | Focus=0.00 | Focus=0.02 | Focus=0.04 | Focus=0.06 |
|---|---|---|---|---|---|---|---|
| 198J | 85.2° | 85.4° | 85.6° | 85.8° | 86.0° | 86.2° | 86.4° |
| 200J | 85.4° | 85.6° | 85.8° | 86.0° | 86.2° | 86.4° | 86.6° |
| 202J | 85.6° | 85.8° | 86.0° | 86.2° | 86.4° | 86.6° | 86.8° |
| 204J | 85.8° | 86.0° | 86.2° | 86.4° | 86.6° | 86.8° | 87.0° |

FIG. 10

| | RESIST PATTERN FORMATION | MEASUREMENT OF DEFOCUSING |
|---|---|---|
| LOT A | FOCUSING CONDITION: STANDARD | DEFOCUSING: 0.04 μm |
| LOT B | FOCUSING CONDITION: STANDARD−0.04 μm | DEFOCUSING: −0.01 μm |
| LOT C | FOCUSING CONDITION: STANDARD−0.03 μm | DEFOCUSING: 0.0 μm |
| LOT D | FOCUSING CONDITION: STANDARD−0.03 μm | DEFOCUSING: −0.01 μm |
| LOT E | FOCUSING CONDITION: STANDARD−0.02 μm | DEFOCUSING: 0.0 μm |
| ... | ... | ... |

METHOD OF MEASURING FOCAL POINT, INSTRUMENT USED THEREFOR, AND METHOD OF FABRICATING SEMICONDUCTOR DEVICE

CROSS-REFERENCE TO RELATED APPLICATIONS

This application is based upon and claims the benefit of priority from the prior Japanese Patent Application No. 2003-338142, filed on Sep. 29, 2003, the entire contents of which are incorporated herein by reference.

BACKGROUND OF THE INVENTION

1. Field of the Invention

The present invention relates to a method and an instrument for measuring a focal variation in pattern exposure in a lithographic process involved in manufacture of semiconductor device or display devices such as liquid crystal display, and also to a method of fabricating a semiconductor device.

2. Description of the Related Art

With recent advancement in the degree of integration of semiconductor devices, patterns formed by lithography are becoming increasingly finer. The finer the patterns become, the smaller the required dimensional uniformities become. One major cause of impairing the dimensional uniformity is represented by focus error (focal variation) of a light exposure apparatus. Any focal variation may result in dimensional variation in the resultant pattern, and this is more distinct for an isolated pattern having only a small depth of focus, causing a considerable reduction in the pattern width. It is generally believed that fabrication of semiconductor devices of 90-nm generation needs focus management of as precise as ±50 nm or around.

An exemplary procedure for the focus management in a conventional light exposure apparatus is as follows. First, sample wafers are fabricated under various set values of the focus typically in the routine inspection, pattern width of the isolated pattern or the like is measured typically using a CD-SEM, and an optimum focus value is determined by preparing focus-CD curve. The obtained result is stored in the light exposure apparatus as an offset value, so as to enable the focus management.

Other proposals of specific examples of the in-line focus monitoring technique are as follows. Patent Document 1 proposes a method of measuring focal variation in which relations between angle of inclination of the resist pattern edge and focus position are obtained, and taper angle of the resist pattern is then calculated to thereby measure the focal variation. Patent Document 2 proposes a method of measuring a focus value based on variations in measured length in the longitudinal direction and thickness of a resist pattern using a specialized mark.

[Patent Document 1]

Japanese Patent Application Laid-open No. Hei 10-154647.

[Patent Document 2]

Japanese Patent Application Laid-open No. 2000-133569.

The focus management according to the conventional technique, however, needs a considerable length of time for the dimensional measurement of the pattern, and this makes it impossible to complete the management within a single day or a shorter time unit, and it is much less possible to monitor the focal variation within a time unit of several hours or still shorter time period. It is also generally believed that the focus management using a product wafer is not practical, because the general product processing does not change the focus within a single wafer or in a single product lot.

Another problem of the in-line focus monitoring technique proposed at present resides in that the detectable focal variation cannot satisfy a necessary level of precision, and that the measurement using the CD-SEM cannot improve reproducibility or accuracy in the measurement. This consequently makes it unpractical to carry out a precise focus monitoring.

The present invention is completed in order to solve the aforementioned problems, and an object thereof is to provide a simple and precise method for measuring focal variation, and is to finally provide a method of measuring a focal point capable of fabricating a semiconductor device in a stable manner through feed-back of information on the measured focal variation to the next product lot, and through feed-forward to the next process; an instrument used therefor; and a method of fabricating a semiconductor device.

SUMMARY OF THE INVENTION

A method of measuring a focal point of the present invention is such as measuring a focal point on a transfer target which comprises the steps of: preliminarily forming, by transfer, at least two types of test resist patterns, which differ from each other in the pattern density, on the transfer target; and calculating a focal variation of the transfer target using the individual test resist patterns.

An instrument for measuring a focal point of the present invention is such as measuring a focal point on a transfer target, using at least two types of test resist patterns, which are first and second test resist patterns differed from each other in the pattern density, preliminarily formed on the transfer target; where the instrument comprises a size measuring unit for measuring a first shape value of the first test resist pattern having a larger pattern density; an exposure energy variation calculating unit for calculating exposure energy variation based on the measured first shape value; a size measuring unit for measuring a second shape value of the second test resist pattern having a pattern density smaller than the first test resist pattern; and a focal variation calculating unit for calculating focal variation of the transfer target based on the measured second shape value and the exposure energy variation.

A method of fabricating a semiconductor device of the present invention comprises a first step of forming a process target film on a semiconductor substrate; a second step of forming a resist film on the process target film; a third step of forming, by pattern transfer to the resist film, at least two types of test resist patterns differed from each other in the pattern density, together with a resist pattern; a fourth step of calculating a focal variation of the process target film using the individual test resist patterns; and a fifth step of judging whether the calculated focal variation falls within a specified range or not; wherein the process advances to the next step if the focal variation was judged as being within the specified range, whereas the resist pattern and the test resist patterns are removed, and the second through fifth steps are repeated if judged as being out of the specified range.

BRIEF DESCRIPTION OF THE DRAWINGS

FIG. 3 is a flow chart sequentially showing the method of measuring the focal variation of the present embodiment;

FIGS. 5A and 5B are tabular expression showing results of Experiment 2 using the method and instrument for measuring focal variation of the present embodiment;

FIG. 10 is a tabular expression showing results of a method of forming precise pattern by setting exposure conditions respectively for product lots comprising a plurality of silicon wafers in an experimental case of the present invention;

DETAILED DESCRIPTION OF THE PREFERRED EMBODIMENTS

Basic Concept of the Invention

Figure 1A:
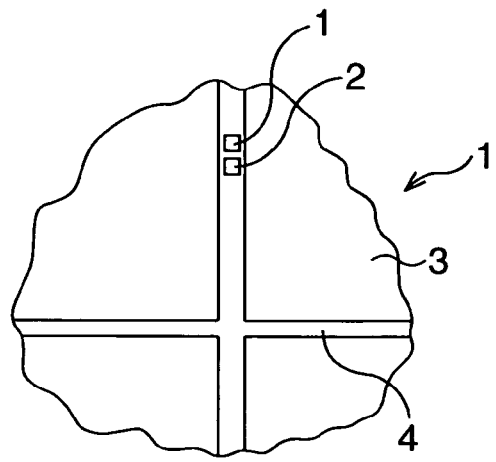
FIGS. 1A to 1C are schematic plan views of a silicon wafer having, formed thereon, resist patterns to be measured for focal variation.

In order to reflect measurement results of a focal variation of a light exposure apparatus in the next product lot or in the next process step to thereby effectively carry out focus correction, it is preferable to adopt the in-line focus monitoring technique using product wafers. The focal variation is, however, measured based on shape values (width, height, taper angle, etc.) of the resist pattern, and changes in the shape values depend on both of the amount of focusing and exposure energy.

The present inventors succeeded in realizing a precise measurement of the focal variation within a short period of time during lithography using the product wafers, by forming and using at least two types of test resist patterns which differ from each other in the pattern density and are formed together with an usual pattern for forming electrodes, wirings and so forth. More specifically, in the present invention, a first state is created using the first test resist pattern so that changes in the shape values depend only on exposure variation (exposure error), and changes in the shape values are then measured in this state, to thereby determine a proper exposure energy based on the measured result. Next, a second state is created using the second test resist pattern so that changes in the shape values depend on both of the exposure energy and focal variation, and changes in the shape values are then measured in this state, to thereby determine the focal variation based on the measured result and the already-obtained proper exposure energy. In the second state, it is made possible to correctly obtain almost pure focal variation by excluding any influences of the exposure energy, from changes in the shape values using the exposure energy determined in the first state.

In the practical lithographic process, it is also anticipated that difference in the optical constants and thickness between the individual layers composing the process target film and the resist film may adversely affect the shape values of the resist pattern. It is therefore preferable that, during the process in which the process target film and the resist film are formed by stacking, the optical constants and thickness of the individual films (individual layers) are measured corresponding to the process target film to be formed, or the optical constants and thickness of the entire (or a portion of) stacked film after the process target film and resist film are formed, and that the measured values are used for the measurement of the shape values to thereby determine the focal variation.

Specific Embodiment of the Present Invention

The following paragraphs will detail specific embodiments applied with the present invention, referring to the attached drawings.

The present embodiment will describe a method of measuring a focal variation of the present invention, an instrument used therefor, a method of correcting a focal variation using the method and instrument, and a method of fabricating a semiconductor device.

Method and Instrument of Measuring Focal Variation

Figure 1B:
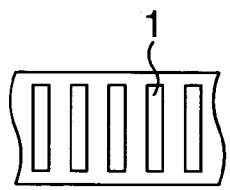
Figure 1C:
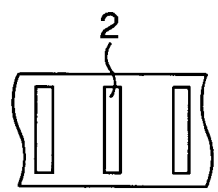
Figure 2:
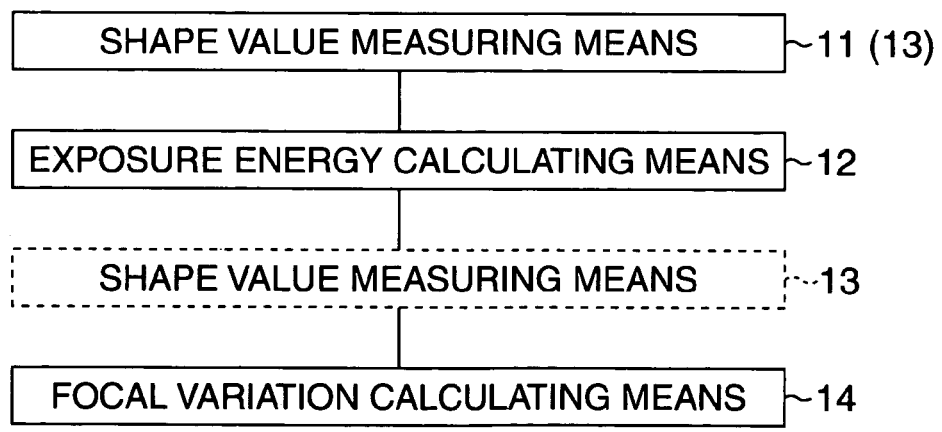
FIG. 2 is a block diagram showing a schematic configuration of a focal variation measuring instrument of the present embodiment.

FIGS. 1A to 1C are schematic plan views of a silicon wafer having, formed thereon, resist patterns to be measured for focal variation, FIG. 2 is a block diagram showing a schematic configuration of a focal variation measuring instrument of the present embodiment, and a FIG. 3 is a flow chart sequentially showing the method of measuring focal variation of the present embodiment.

In the present embodiment, as shown in FIG. 1A, together with various resist patterns formed on a silicon wafer 10 (in a formation area of the resist pattern 3) by a lithographic process, a plurality of types (two types, herein) of test resist patterns 1, 2 are formed in a non-forming area of the resist pattern, typically in a scribing area 4.

The first test resist pattern 1 is, as shown in FIG. 1B, a pattern showing a so-called pivotal characteristic having a large pattern density, and is exemplified herein by a line-and-space (L&S) pattern having a dimensional ratio of 1:1. The second test resist pattern 2 has, as shown in FIG. 1C, a pattern density smaller than that of the first test resist pattern, and is exemplified herein by a pattern density which is almost assumable as an isolated pattern (simply referred to as the "isolated pattern" for the convenience sake, hereinafter).

The focal variation measuring instrument is configured, as shown in FIG. 2, as having a shape value measuring unit 11 for measuring shape values of the first test resist pattern 1, a proper exposure energy calculating unit 12 for calculating a proper exposure energy based on the measured shape values, a shape value measuring unit 13 for measuring shape values of the second test resist pattern 2, and a focal variation calculating unit 14 for calculating a focal variation of the silicon wafer 10 based on the measured shape values and the proper exposure energy. The shape values described herein unit values ascribable to the geometry of the resist pattern, and more specifically, unit information on height, taper angle, width and the like obtained by approximating the transverse sectional shape of the resist pattern with a plurality of rectangles.

The shape value measuring unit 11, 13 may be various measuring instruments such as an electron microscope, atomic force microscope, optical width measuring instrument and so forth capable of providing high precision measurement, where both of which may be configured as an identical instrument not only for the case where the shape values to be measured are the same, but also for the case where the shape values to be measured are different from each other (for example width and height, or taper angle). The proper exposure energy calculating unit 12 determines a proper exposure energy using the shape values measured by the shape value measuring unit 11, and also by using a first data base which expresses relations between the shape values and the exposure energy. The shape value measuring unit 13 measures a geometry of the second test resist pattern 2. The focal variation calculating unit 14 determines a focal variation using the proper exposure energy determined by the proper exposure energy calculating unit 12, and also by using a second data base which expresses relations of the exposure energy and the shape values with the focal variation.

When the focal variation is measured using the focal variation measuring instrument, first as shown in FIG. 3, the shape values of the first test resist pattern showing the pivotal characteristic is measured (step S1). The first test resist pattern shows only an extremely small variation in the shape values with respect to the focal variation, so that it is possible to detect, from the measured value thereof, variation in the exposure energy. The first data base is then accessed using the measured value (step S2), and the exposure energy is calculated (step S3). The first data base herein stores information which expresses relations between the preliminarily-accumulated shape values of the resist pattern having the pivotal characteristic and the exposure energy.

Next, the shape values of the second test resist pattern, which is an isolated pattern, are measured (step S4). The shape values of the second test resist pattern vary depending on both of the focal variation and variation in the exposure energy. The second data base is then accessed based on the measured result (step S5), and the focal variation is determined using the proper exposure energy calculated from the first test resist pattern (step S6). The second data base herein stores the information which expresses relations of the preliminarily-stored shape values of the isolated pattern and the exposure energy with the focal variation. The measurement of the shape values of two types of the resist patterns as described in the above is successful in determining the focal variation in a precise manner.

The next paragraphs will describe a specific example of an experiment applied with the method and the instrument for measuring the focal variation of the present embodiment.

(Experiment 1)

Experiment 1 will describe a technical process through which the focal variation can exactly be obtained by actually using two types of the test resist patterns which differ from each other in the pattern density.

Figure 4A:
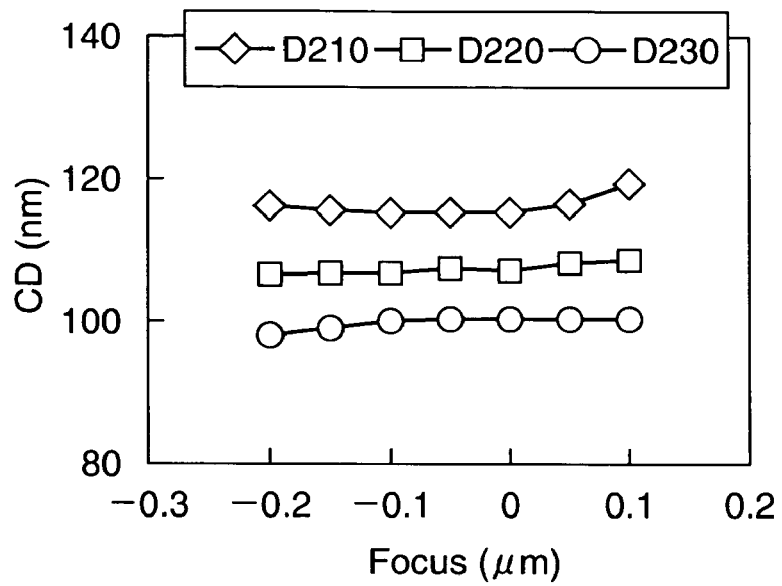
FIGS. 4A and 4B are characteristic drawings showing results of Experiment 1 using the method and instrument for measuring focal variation of the present embodiment.

FIG. 4A is a characteristic drawing showing focus-CD (critical dimension) characteristic, which expresses relations between the focal variation and the pattern width value, when an L&S pattern (first test resist pattern) showing the pivotal characteristic, having a width of 110 nm and having a dimensional ratio of 1:1. The focal variation is plotted on the abscissa, and width on the ordinate. Three lines in the drawing indicate focus-CD characteristics under exposure energies varied as 210 J, 220 J and 230 J, respectively.

It is found from FIG. 4A that the first test resist pattern having a pivotal characteristic shows variation in the width which depends on variation in the exposure energy, but scarcely depends on the focal variation and remains almost constant. This can be understood that the adoption of the first test resist pattern is successful in excluding influences of the focal variation from the width value, and indicates that only a proper exposure energy can be determined from the measured width value.

Figure 4B:
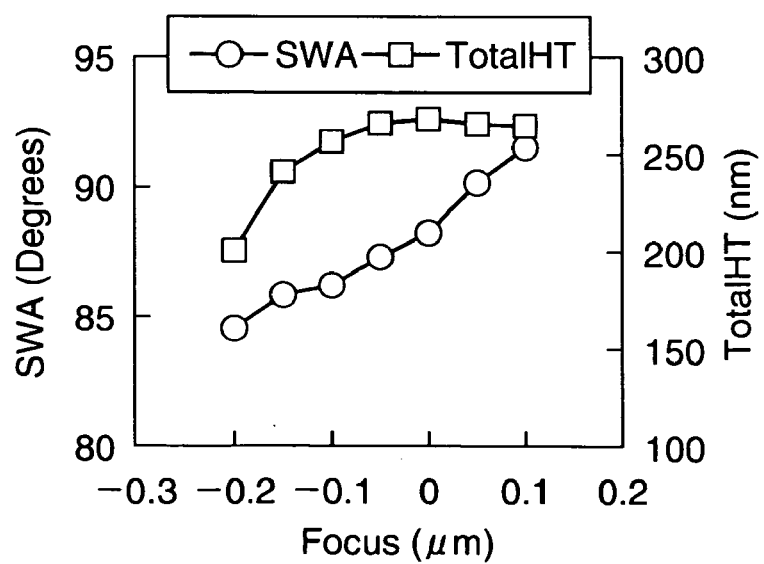

FIG. 4B is a characteristic drawings showing relations of the focal variation, taper angle and height of an isolated pattern (second test resist pattern) having a pitch of 1,000 nm and a width of 110 nm. The focal variation is plotted on the abscissa. The first ordinate (ordinate on the left side of the drawing) plots so-called sidewall angle (SWA), which indicates the taper angle of the obtained resist pattern which is assumed as having a simple trapezoidal shape. The second ordinate (ordinate on the right side of the drawing) plots the height of the trapezoidal pattern.

FIG. 4B shows that the taper angle increases as the focus value shifts towards the positive direction (plus-defocusing). Also the height of the resist pattern also increases by the plus-defocusing, it reaches a plateau if the amount of defocusing is increased to a certain degree. This means that the individual shape values (sidewall angle, taper angle) vary depending on the focal variation, and respectively show their specific modes of dependence. Because the shape values vary mainly depending on two main parameters, that are exposure energy and focus value, the intentional use of the second test resist pattern showing no pivotal characteristic and use of the previously-determined proper exposure energy make it possible to assume the measured shape values as being exempt from influences of the exposure energy, and to obtain only the focal variation.

It is made clear from these findings that the use of two types of test resist patterns having different pattern densities makes it possible to estimate the focal variation in a highly precise manner.

(Experiment 2)

Experiment 2 will describe an exemplary case for estimating the focal variation by actually using two data bases.

FIGS. 5A and 5B show exemplary first data base and second data base, respectively.

The first data base specifies relations between the width values and exposure energies for the case where a pattern showing the pivotal characteristic and having an L&S pattern (first test resist pattern) characterized by a width of 110 nm and a size ratio of 1:1 is used. It is found that the width value varies as the exposure energy varies, where the taper angle remains almost unchanged.

The second data base specifies relations among exposure energy, taper angle and focal variation for the case where an isolated pattern, which is herein a pattern (second test resist pattern) characterized by a pitch of 1,000 nm and a width of 110 nm.

For example, when the first test resist pattern was measured as having a width of 118 nm, a proper exposure energy herein can be found as 202 J referring to the first data base. Assuming now that the second test resist pattern has a taper angle of 86.6°, and considering the proper exposure energy already known to be 202 J, the focal variation can be found as +0.04 µm referring to the second data base. Thus the focal variation, which means an exposure error when the resist on the wafer is exposed, can be determined as +0.04 µm.

MODIFIED EXAMPLE 1

Figure 6:
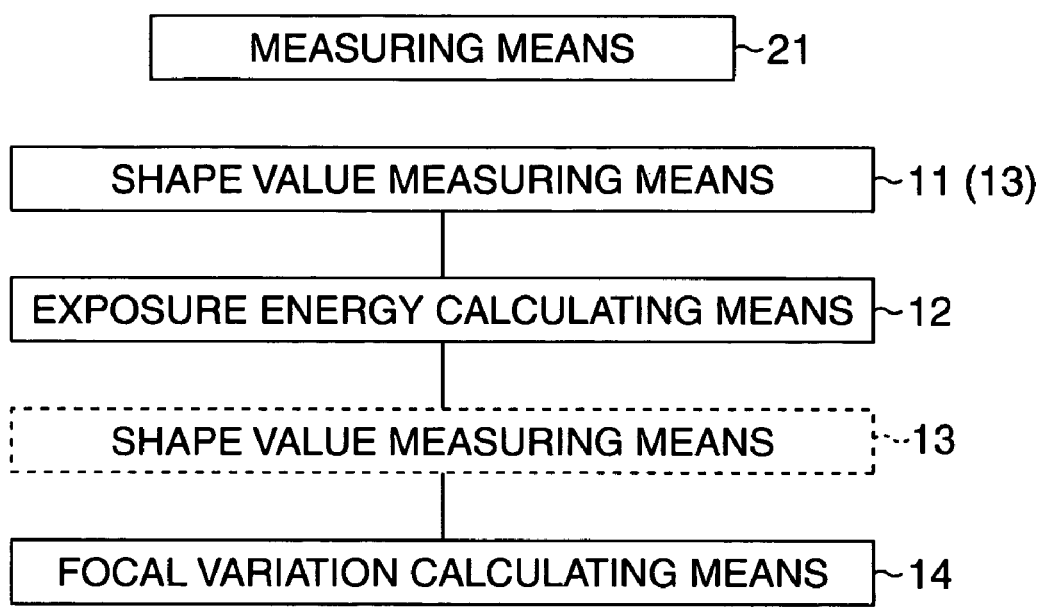
FIG. 6 is a block diagram showing a schematic configuration of a focal variation measuring instrument in modified example 1 of the present embodiment.

FIG. 6 is a block diagram showing a schematic configuration of a focal variation measuring instrument in a modified example 1 of the present embodiment.

The focal variation measuring instrument is configured as having a shape value measuring unit 11 for measuring shape values of the first test resist pattern 1, a proper exposure energy calculating unit 12 for calculating a proper exposure energy based on the measured shape values, a shape value measuring unit 13 for measuring shape values of the second test resist pattern 2, a measuring unit 22 which is an optical measuring instrument for measuring optical constants and thickness, and a focal variation calculating unit 14 for calculating focal variation of the silicon wafer 10 based on the measured shape values and proper exposure energy.

For the case where at least one process target film and a resist film are formed by stacking on the wafer, and the resist film is then subjected to the light exposure so as to form, by transfer, the first and second test resist patterns 1, 2 together with the resist pattern typically for the gate electrode, at least either one of the individual process target films and resist film is preliminarily measured for the optical constants and thickness using the measuring unit 21, and results of the measurement are used for the calculation of the focal variation by the focal variation calculating unit 14.

FIGS. 7A to 7D are schematic sectional views showing film forming processes necessary for formation of gates on a wafer. In this process, the resist film formed on a certain process target film is patterned to thereby form the resist pattern for patterning the gates in the gate-forming area, and the first and second test resist patterns in the scribing area.

Figure 7A:
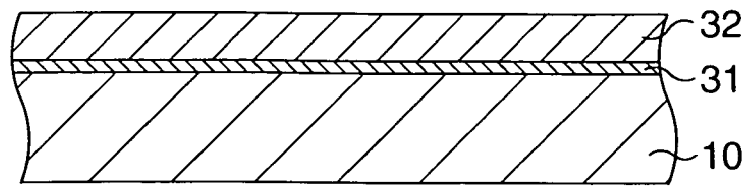
FIGS. 7A to 7D are schematic sectional views showing film forming processes necessary for formation of gates on a wafer, and corresponded states of the wafer in modified example 1 of the present embodiment.

First, as shown in FIG. 7A, a polysilicon film 32 is formed on the silicon wafer 10 while placing a thin silicon oxide film 31, which serves as a gate insulating film, in between, and the polysilicon film 32 is then measured for its optical constants and thickness using the measuring instrument 21. Because the silicon oxide film 31 herein is extremely thin as compared with the polysilicon film 32, the optical constants and thickness thereof have only negligible values.

Figure 7B:
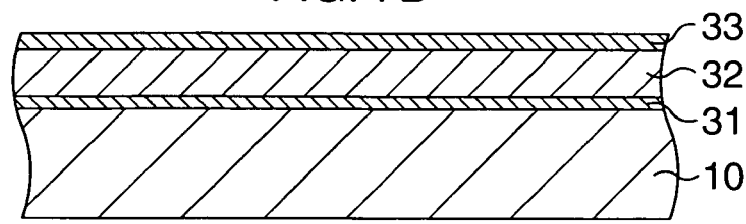

Next, as shown in FIG. 7B, a silicon oxide film 33 later used as an etching mask is formed, and the optical constants and thickness thereof are measured similarly to as described in the above. Use of the measured values of the optical constants and thickness of the polysilicon film 32 already obtained in the above can ensure more precise measurement.

Figure 7C:
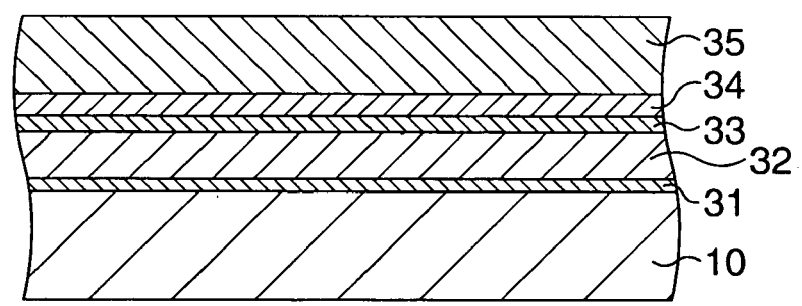

Next, as shown in FIG. 7C, an anti-reflective film 34 and a resist film 35 are sequentially formed, and the thickness and optical constants of the resist film 35 and anti-reflective film 34 are measured in an area where the resist film 35 has no pattern but formed in solid. Use of the measured values of the optical constants and thickness of the polysilicon film 32 and silicon oxide film 33 already obtained in the above can ensure more rapid and precise measurement.

Figure 7D:
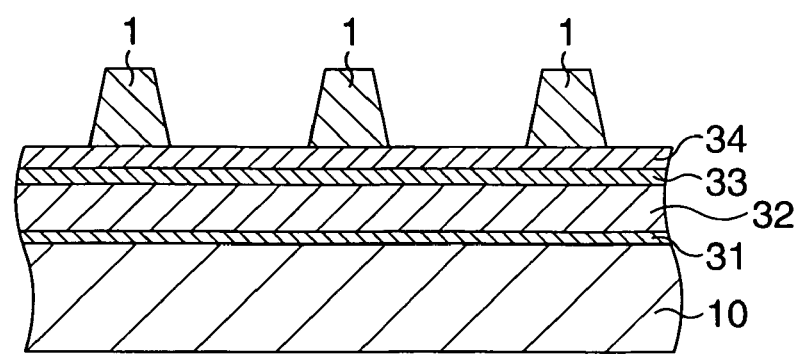

Next, as shown in FIG. 7D, the resist film 35 is processed by lithography, to thereby form a resist pattern (not shown) having a gate pattern in the gate forming area, and the first and second test resist patterns 1, 2 (only the first test resist pattern 1 illustrated herein) in the scribing area.

After going through steps S1 through S5 shown in FIG. 3 for example, the focal variation of the silicon wafer is calculated in step S6. The focal variation is determined using the proper exposure energy calculated based on the first test resist pattern 1, the shape values of the second test resist patterns, and the above-described individual measured values of the optical constants and thickness.

Measurement of the shape values of the individual test resist patterns formed on multi-layered process target films using an ordinary light or polarized light is largely affected by parameters such as the thickness and optical constants of the process target films, so that modified example 1 allows the individual measured values of the optical constants and thickness of the process target films (31 to 34 in the above example) and the resist film to be reflected in the calculation of the focal variation, to thereby succeed in measuring the shape values with an advanced accuracy. It is to be noted in this case that the resist patterns positioned closer to the individual test resist patterns can more precisely be measured for the shape values.

MODIFIED EXAMPLE 2

In modified example 2, the optical constants and thickness are preliminarily measured using the instrument configured similarly to as described in modified example 1, and the measured results are used for the calculation of the focal variation using the focal variation calculating unit, where a method of calculating the optical constants and thickness differs from that in modified example 1.

Figure 8A:
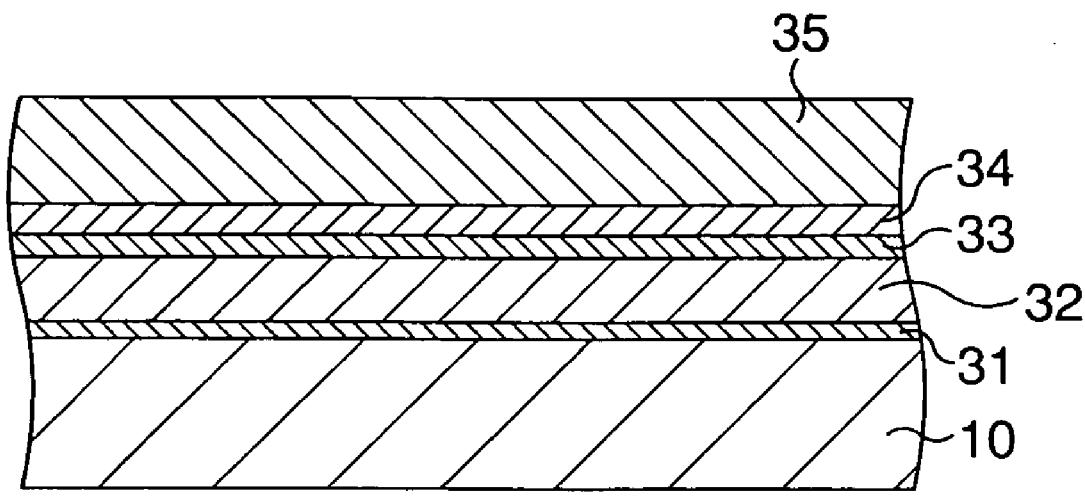
FIGS. 8A and 8B are schematic sectional views showing film forming processes necessary for formation of gates on a wafer, and corresponded states of the wafer in modified example 2 of the present embodiment.
Figure 8B:
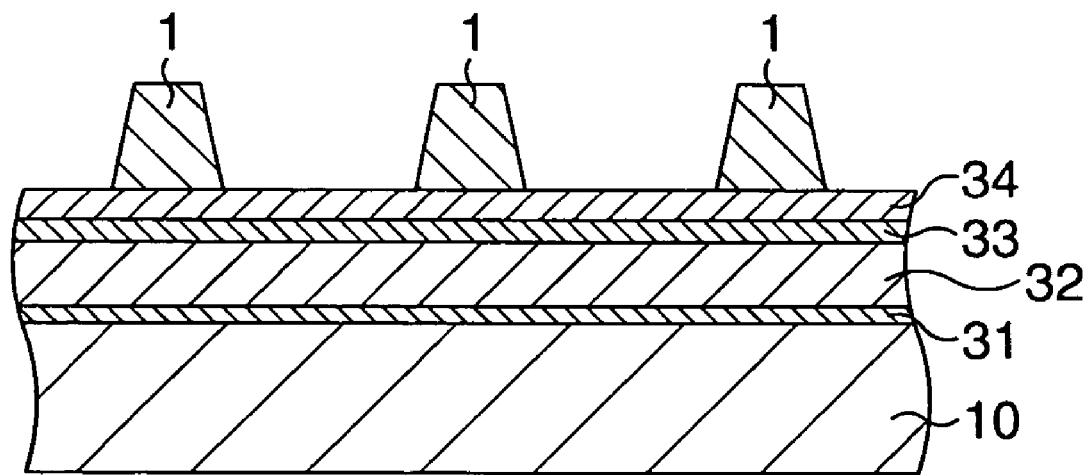

FIGS. 8A and 8B are schematic sectional views showing film forming processes necessary for formation of gates on a wafer, and corresponded states of the wafer. In this process, the resist film formed on a certain process target film is patterned to thereby form the resist pattern for patterning the gates in the gate-forming area, and the first and second test resist patterns in the scribing area.

First, as shown in FIG. 8A, the polysilicon film 32 is formed on the silicon wafer 10 while placing a thin silicon oxide film 31, which serves as a gate insulating film, in between, and the silicon oxide film 33 for forming the etching mask, the anti-reflective film 34, and resist film 35 are sequentially formed. The film thickness and the optical constants are measured with respect to the entire stack which comprises the process target film, having the component films 31 to 34, and the resist film 35.

Next, as shown in FIG. 8B, the resist film 35 is processed by lithography, to thereby form a resist pattern (not shown) having a gate pattern in the gate forming area, and the first and second test resist patterns 1, 2 (only the first test resist pattern 1 illustrated herein) in the scribing area.

After going through steps S1 through S5 shown in FIG. 3 for example, the focal variation of the silicon wafer is calculated in step S6. The focal variation is determined using the proper exposure energy calculated based on the first test resist pattern 1, the shape values of the second test resist patterns, and the above-described individual measured values of the optical constants and thickness.

Measurement of the shape values of the individual test resist patterns formed on multi-layered process target films using an ordinary light or polarized light is largely affected by parameters such as the thickness and optical constants of the process target films, so that modified example 2 allows the individual measured values of the optical constants and thickness of the process target films (31 to 34 in the above example) and the resist film to be reflected in the calculation of the focal variation, to thereby succeed in measuring the shape values with an advanced accuracy. Modified example 2 is also successful in calculating the focal variation in a more rapid and simpler manner than in modified example 1, because the overall thickness and the optical constants are measured en bloc in a state in which all of the layers composing the process target film and the resist film have already been formed.

Focal Variation Correcting Method

In this embodiment, the focal variation is found as described in the above, and based on the information, the focal variation is corrected.

Figure 9:
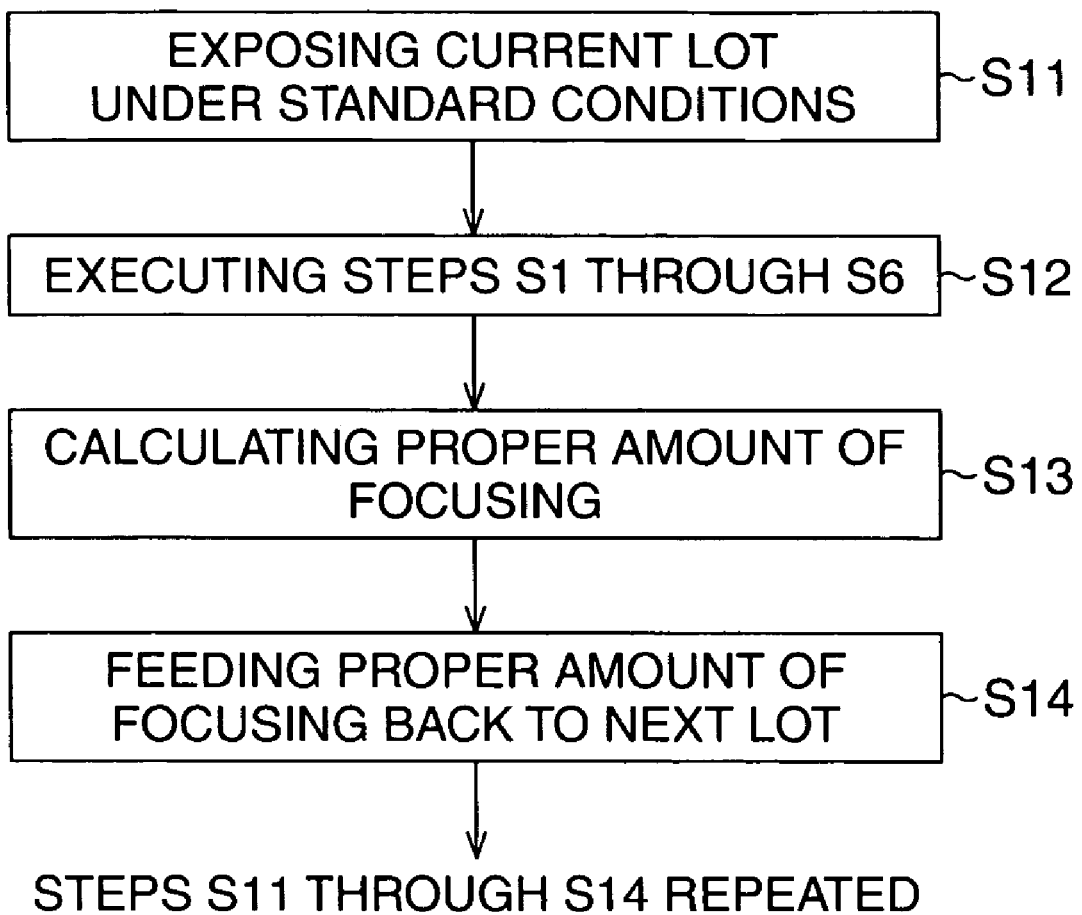
FIG. 9 is a flow chart sequentially showing steps of a method of correcting focal variation of the present embodiment.

FIG. 9 is a flow chart sequentially showing steps of a method of correcting focal variation of the present embodiment.

In the correction method, a first lot is subjected to pattern transfer (step S11) by light exposure under the standard focusing condition. Next, the focal variation of the first lot is calculated typically according to steps S1 through S6 shown in FIG. 3 (step S12). Next, a proper amount of focusing is calculated based the calculated focal variation (step S13), and the obtained proper amount of focusing is fed back to the succeeding second lot (step S14).

Steps S11 through S13 are then applied to the second lot based on the proper amount of focusing, and the result therefrom is further fed back to the succeeding third lot (step S14). Steps S11 to S14 are sequentially applied in this way to the next lot.

(Experimental Case)

A specific experimental case applied with the method of correcting focal variation of the present embodiment will be described.

FIG. 10 is a tabular expression showing results of a method of forming precise pattern by setting exposure conditions respectively for product lots comprising a plurality of silicon wafers. In this experiment, lot "A" was first exposed under the standard focusing condition. The width and shape of the individual test resist patterns were measured by steps S1 through S6 in FIG. 3, and the focal variation was found to be 0.04 μm.

Then lot "B" was exposed while applying a focus offset of −0.04 μm to the standard condition in reflection of the focal variation condition obtained for lot "A" exposed immediately therebefore. The width and shape of the individual test resist patterns were measured by steps S1 through S6 in FIG. 3, and the focal variation was found to be 0.01 μm.

Lot "C" was then similarly processed. The exposure herein was carried out while applying a focus offset of −0.03 μm to the standard condition in reflection of the focal variation condition obtained for lot "B". No focal variation was observed.

The succeeding lot "D" was also processed under the same conditions with lot "C" and calculated for the focal variation, which proved a focal variation of −0.01 μm. The next lot "E" was processed while applying a focus offset of 0.02 μm to the standard condition.

Reflection of the previous result of focal variation in the next lot makes it possible to carry out a highly precise focus control.

Method of Fabricating Semiconductor Device
Including Measurement of Focal Variation In the present embodiment, the focal variation is found as described in the above in the lithographic process, and a desired pattern formation is carried out using the result in a highly precise manner.

Figure 11:
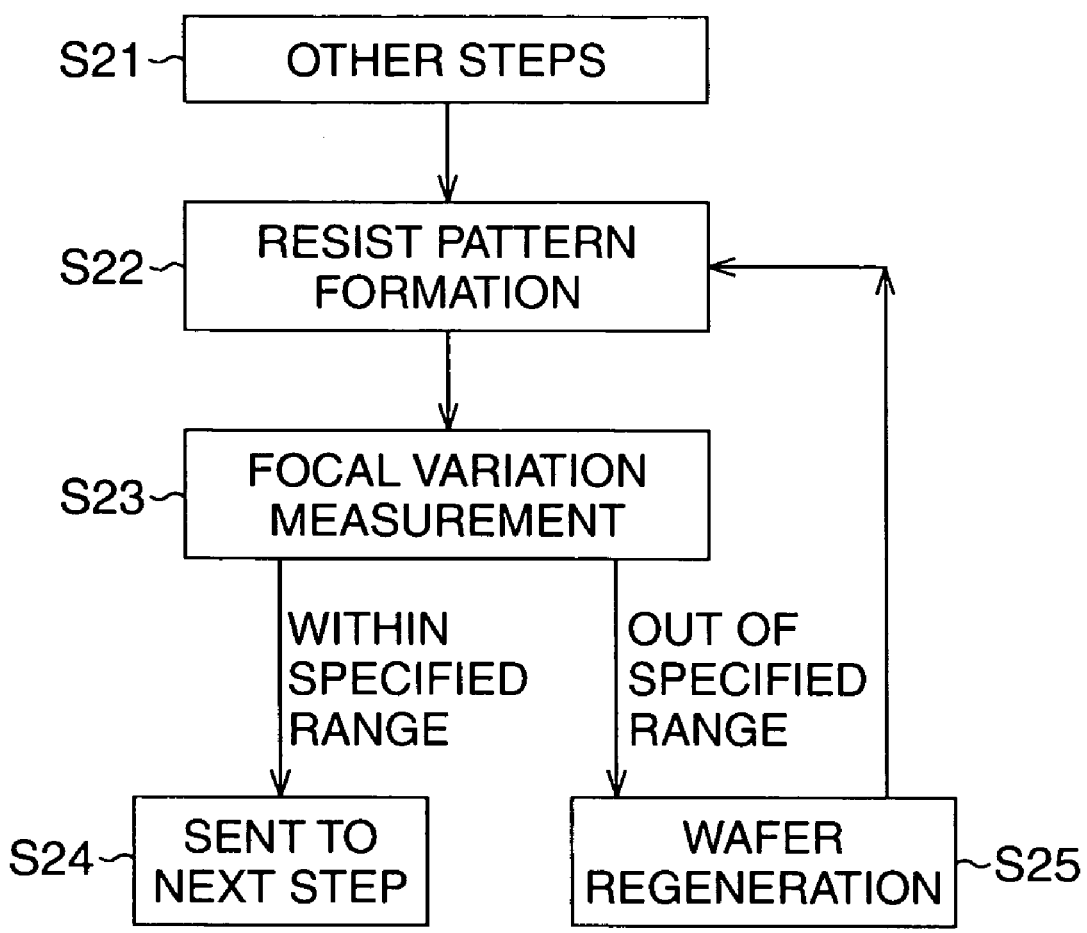
FIG. 11 is a flow chart showing a lithographic process in a method of fabricating a semiconductor device, applied with a method of correcting focal variation of the present embodiment.

FIG. 11 is a flow chart showing a lithographic process in a method of fabricating a semiconductor device, applied with a method of correcting focal variation of the present embodiment.

First, a lot accepted from step S21, which is a pre-process (photo-mask fabrication step, wafer fabrication step, etc.), is subjected to the light exposure, to thereby form the individual test resist patterns and various resist patterns (step S22).

Next, the focal variation is calculated by the above-described focal variation measurement, which is specifically steps S1 through S6 shown in FIG. 3 (step S23).

The process advances to the next step (assembling step including dicing, etc.) if the focal variation was judged as being within the specified range (step S24), whereas the resist pattern are removed, and the light exposure is repeated once again (step S25) if judged as being out of the specified range. In the re-processing, feedback of the focal variation out of the specified range in the light exposure allows a highly precise pattern formation. The process can advance to the next process only when the result is found to be of no problem. This procedure is expected to largely improve yield ratio of the product.

Other Embodiment Applied with Present Invention

The individual means composing the focal variation measuring instrument of the above-described embodiment (exclusive of shape value measuring unit and measuring unit), and the individual steps of the method of measuring the focal variation, the method of correcting the focal variation, and the method of fabricating the semiconductor device (steps S1 to S6 in FIG. 3, steps S11 to S14 in FIG. 9, steps S21 to S24 in FIG. 13, etc.) can be realized by run of a program stored in a RAM or ROM of a computer. The program and a computer-readable recording medium having the program stored therein are also included within a scope of the present invention.

More specifically, the above-described program is recorded in a recording medium such as CD-ROM, or supplied to the computer through various transmission media. Besides CD-ROM, examples of the above-described recording medium for storing the program include flexible disk, hard disk, magnetic tape, magneto-optical disk and non-volatile memory card. On the other hand, the transmission media of the program include communication media (wireline such as using optical fiber, wireless line, etc.) in computer network (LAN, WAN such as the Internet, wireless communication network, etc.) systems for transmitting program information on carrier wave.

The program is included in the present invention not only when the program is run on a computer to which the program is supplied so as to realize the functions of the above-described embodiments, but also when the program realizes the function of the above-described embodiments in cooperation with an OS (operating system) running on the computer or with other application software, and also when the entire portion or a part of the processing of the supplied program is run on a functional expansion board or on a functional expansion unit so as to realize the functions of the above-described embodiment.

Figure 12:
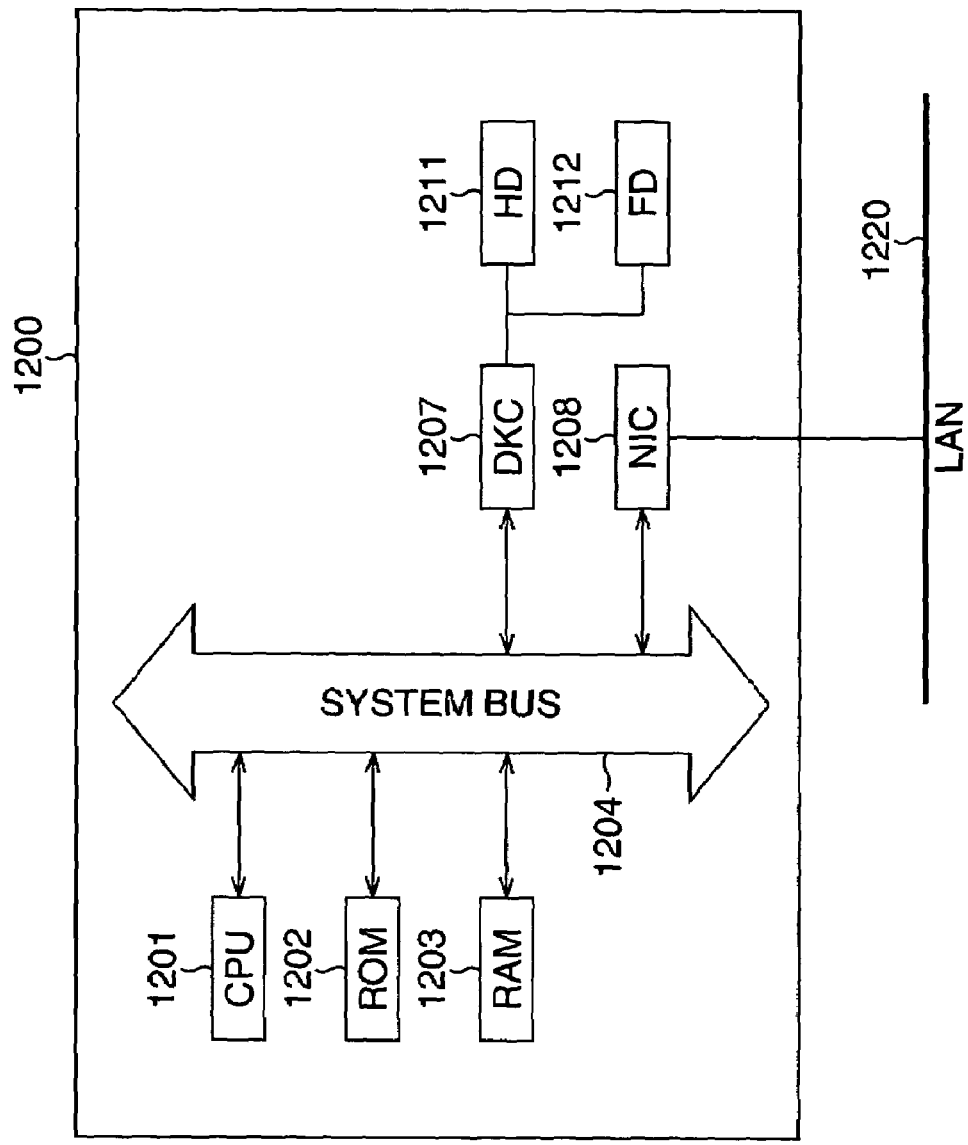
FIG. 12 is a schematic drawing showing an internal configuration of a personal user terminal device.

For example, FIG. 12 is a schematic drawing showing an internal configuration of a personal user terminal device. In FIG. 12, reference numeral 1200 represents a computer PC. The PC 1200 has a CPU 1201, and is configured so as to execute a device control software stored in a ROM 1201 or a hard disk (HD) 1211, or supplied from a flexible disk drive (FD) 1212, to thereby generally control the individual devices connected to a system bus 1204.

The present invention is thus successful in measuring the focal variation in a simple and precise manner. It is also made possible to form a precise and fine pattern by allowing results of the focal variation to be reflected in the next product lot or in the next process step.

What is claimed is:

1. A method of measuring a focal point on a transfer target having a pattern transferred thereon, comprising the steps of:
preliminarily forming, by transfer, at least two types of test resist patterns, which differ from each other in the pattern density, on said transfer target; and calculating a focal variation of said transfer target using said individual test resist patterns, wherein said test resist patterns include a first test resist pattern having a larger pattern density and a second test resist pattern having a smaller pattern density, and the method further comprising the steps of measuring a first shape value of said first test resist pattern, calculating a proper exposure energy based on said first shape value, measuring a second shape value of said second test resist pattern, and calculating a focal variation of said transfer target based on said second shape value and said proper exposure energy.

2. The method of measuring a focal point according to claim 1, wherein said first test resist pattern shows a pivotal characteristic, and said second test resist patterns shows no pivotal characteristic.

3. The method of measuring a focal point according to claim 1, wherein said shape value is at least one of width, height and taper angle.

4. The method of measuring a focal point according to claim 1, wherein in the calculation of said proper exposure energy, said first shape value is measured, and then said proper exposure energy is determined using a first data base which expresses relations between said first shape value and said proper exposure energy.

5. The method of measuring a focal point according to claim 1, wherein in the calculation of said focal variation, said second shape value is measured, and then said focal variation is determined using a second data base which expresses relations of said proper exposure energy and said second shape value with said focal variation.

6. The method of measuring a focal point according to claim 1, wherein said individual test resist patterns are formed by transfer, together with resist pattern, by stacking at least one process target film and a resist film on said transfer target, and then subjecting said resist film to light exposure, and said focal variation is calculated using results of measurement of optical constants and film thickness preliminarily made on at least either one of said process target film and said resist film.

7. The method of measuring a focal point according to claim 6, wherein the measurement of said optical constants and said film thickness is made on the entire stacked film having all of the individual process target films and said resist film formed therein by stacking.

8. The method of measuring a focal point according to claim 1, wherein the pattern is transferred under a proper amount of focusing, said amount of focusing being obtained based on said calculated focal variation, and being fed back to said individual transfer targets or to a product lot comprising a plurality of said transfer targets.

9. An instrument for measuring a focal point on a transfer target having a pattern transferred thereon, using at least two types of test resist patterns, which are first and second test resist patterns differed from each other in the pattern density, preliminarily formed on said transfer target; comprising:

a size measuring unit for measuring a first shape value of said first test resist pattern having a larger pattern density;

an exposure energy variation calculating unit for calculating exposure energy variation based on said measured first shape value;

a size measuring unit for measuring a second shape value of said second test resist pattern having a pattern density smaller than said first test resist pattern; and a focal variation calculating unit for calculating focal variation of said transfer target based on said measured second shape value and said exposure energy variation.

10. The instrument for measuring a focal point according to claim 9, wherein said first test resist pattern shows a pivotal characteristic, and said second test resist patterns shows no pivotal characteristic.

11. The instrument for measuring a focal point according to claim 9, wherein said shape value is at least one of width, height and taper angle.

12. The instrument for measuring a focal point according to claim 9, wherein said exposure energy variation calculating unit determines said proper exposure energy by using a first data base which expresses relations between said measured first shape value and said proper exposure energy.

13. The instrument for measuring a focal point according to claim 9, wherein said focal variation calculating unit determines said focal variation using a second data base which expresses relations of said measured proper exposure energy and said second shape value with said focal variation.

14. The instrument for measuring a focal point according to claim 9, wherein said individual test resist patterns are formed by transfer, together with resist pattern, by stacking at least one process target film and a resist film on said transfer target, and then subjecting said resist film to light exposure, and further comprising a measuring unit for measuring optical constants and film thickness, which preliminarily measures said optical constants and film thickness of at least either one of said process target film and said resist film, results of said measurement being used for calculating said focal variation.

15. The instrument for measuring a focal point according to claim 14, wherein said measuring unit measures said optical constants and said film thickness of the entire stacked film having all of the individual process target films and said resist film formed therein by stacking.

16. A method of fabricating a semiconductor device comprising:

a first step of forming a process target film on a semiconductor substrate;

a second step of forming a resist film on said process target film;

a third step of forming, by pattern transfer to said resist film, at least two types of test resist patterns differed from each other in the pattern density, together with a resist pattern;

a fourth step of calculating a focal variation of said process target film using said individual test resist patterns; and a fifth step of judging whether said calculated focal variation falls within a specified range or not; wherein the process advances to the next step if said focal variation was judged as being within the specified range, whereas said resist pattern and said test resist patterns are removed, and said second through fifth steps are repeated if judged as being out of the specified range, wherein said test resist patterns include a first test resist pattern having a larger pattern density and a second test resist pattern having a smaller pattern density; and said fourth step further comprises the steps of measuring a first shape value of said first test resist pattern, calculating a proper exposure energy based on said first shape value, measuring a second shape value of said second test resist pattern, and calculating said focal variation of said transfer target based on said second shape value and said proper exposure energy.

17. The method of fabricating a semiconductor device according to claim 16, wherein said first test resist pattern shows a pivotal characteristic, and said second test resist patterns shows no pivotal characteristic.

18. The method of fabricating a semiconductor device according to claim 16, wherein said shape value is at least one of width, height and taper angle.

19. The method of fabricating a semiconductor device according to claim 16, wherein in the calculation of said proper exposure energy in said fourth step, said first shape value is measured, and then said proper exposure energy is determined using a first data base which expresses relations between said first shape value and said proper exposure energy.

20. The method of fabricating a semiconductor device according to claim 16, wherein in the calculation of said focal variation in said fourth step, said second shape value is measured, and then said focal variation is determined using a second data base which expresses relations of said proper exposure energy and said second shape value with said focal variation.

21. The method of fabricating a semiconductor device according to claim 16, wherein in said third step, said optical constants and film thickness of at least either one of said process target film and said resist film are preliminarily measured, and results of the measurement are used for calculating said focal variation.

22. The method of fabricating a semiconductor device according to claim 21, wherein said optical constants and said film thickness are measured for the entire stacked film having all of the individual process target films and said resist film formed therein by stacking.

23. The method of fabricating a semiconductor device according to claim 16, wherein the pattern is transferred under a proper amount of focusing, said proper amount of focusing being obtained based on said focal variation calculated in said fourth step, and being fed back to said individual transfer targets or to a product lot comprising a plurality of said transfer targets.

* * * * *